US012574023B2

(12) United States Patent
Li et al.

(10) Patent No.: US 12,574,023 B2
(45) Date of Patent: Mar. 10, 2026

(54) COMBO CIRCUIT WITH ELECTROSTATIC DISCHARGE PROTECTION

(71) Applicant: Leadtrend Technology Corp., Hsinchu County (TW)

(72) Inventors: Jhen-Hong Li, Hsinchu County (TW); Chiung-Fu Huang, Hsinchu County (TW); Chih-Yao Chang, Hsinchu County (TW); Cheng-Sheng Kao, Hsinchu County (TW); Chih-Wen Hsiung, Hsinchu County (TW)

(73) Assignee: Leadtrend Technology Corp., Hsinchu County (TW)

( * ) Notice: Subject to any disclaimer, the term of this patent is extended or adjusted under 35 U.S.C. 154(b) by 0 days.

(21) Appl. No.: 18/964,719

(22) Filed: Dec. 2, 2024

(65) Prior Publication Data

US 2025/0211219 A1      Jun. 26, 2025

Related U.S. Application Data

(60) Provisional application No. 63/613,757, filed on Dec. 22, 2023.

(51) Int. Cl.
| | |
|---|---|
| *H03K 7/08* | (2006.01) |
| *H03K 3/313* | (2006.01) |
| *H03K 3/356* | (2006.01) |

(52) U.S. Cl.
CPC ............... *H03K 7/08* (2013.01); *H03K 3/313* (2013.01); *H03K 3/356104* (2013.01)

(58) Field of Classification Search
CPC .... H03K 7/08; H03K 3/313; H03K 3/356104; H02H 9/04
USPC ......................................................... 332/109
See application file for complete search history.

(56) References Cited

U.S. PATENT DOCUMENTS

| | | | |
|---|---|---|---|
| 11,356,087 B2 | 6/2022 | Seeman | |
| 2015/0346265 A1* | 12/2015 | Koh ..................... | G01R 19/165 324/538 |

FOREIGN PATENT DOCUMENTS

| | | | |
|---|---|---|---|
| CN | 109217276 | * | 1/2019 |
| TW | 202347301 A | | 12/2023 |

* cited by examiner

*Primary Examiner* — Richard Tan
(74) *Attorney, Agent, or Firm* — Winston Hsu

(57)      ABSTRACT

A combo circuit with electrostatic discharge protection includes a pulse width modulation integrated circuit and a power integrated circuit. The pulse width modulation integrated circuit has an electrostatic discharge protection circuit and the electrostatic discharge protection circuit is installed between a source of the power integrated circuit and a reference ground potential of the combo circuit.

10 Claims, 6 Drawing Sheets

4022

COMBO CIRCUIT WITH ELECTROSTATIC DISCHARGE PROTECTION

CROSS REFERENCE TO RELATED APPLICATIONS

This application claims the benefit of U.S. Provisional Application No. 63/613,757, filed on Dec. 22, 2023. The content of the application is incorporated herein by reference.

BACKGROUND OF THE INVENTION

1. Field of the Invention

The present invention relates to a combo circuit, and particularly to a combo circuit with electrostatic discharge protection.

2. Description of the Prior Art

In the prior art, a pulse width modulation (PWM) integrated circuit and a power integrated circuit can be integrated into a single chip combo circuit by using a single chip combo process to reduce an area of the single chip combo circuit, wherein a source of the power integrated circuit is coupled to a pin of the single chip combo circuit, and the pin is not coupled to reference ground potential.

However, because the pin is not coupled to the reference ground potential, when the source of the power integrated circuit has excess positive charges or excess negative charges, both of the excess positive charges and the excess negative charges cannot be neutralized by the reference ground potential, resulting in the power integrated circuit being burned out. Therefore, how to design the single chip combo circuit to make the single chip combo circuit have electrostatic discharge protection has become an important issue.

SUMMARY OF THE INVENTION

An embodiment of the present invention provides a combo circuit with electrostatic discharge protection. The combo circuit with electrostatic discharge protection includes a pulse width modulation (PWM) integrated circuit and a power integrated circuit. The pulse width modulation (PWM) integrated circuit has an electrostatic discharge protection (ESD) circuit. The electrostatic discharge protection circuit is installed between a source of the power integrated circuit and a reference ground potential of the combo circuit.

According to one aspect of the present invention, the pulse width modulation integrated circuit further includes a first metal oxide semiconductor field effect transistor and a gate control circuit. A drain of the first metal oxide semiconductor field effect transistor is coupled to the gate control circuit, a gate of the first metal oxide semiconductor field effect transistor is coupled to another circuit within the pulse width modulation integrated circuit, and a source of the first metal oxide semiconductor field effect transistor is coupled to the reference ground potential, wherein the gate control circuit is used for generating a pulse width modulation signal to the power integrated circuit.

According to one aspect of the present invention, the power integrated circuit includes a gallium nitride (GaN) high electron mobility transistor (HEMT) and a laterally double-diffused metal oxide semiconductor field effect transistor (LDMOS). A source of the GaN high electron mobility transistor is coupled to a drain of the laterally double-diffused metal oxide semiconductor field effect transistor, a gate of the GaN high electron mobility transistor is coupled to a source of the laterally double-diffused metal oxide semiconductor field effect transistor, and a gate of the laterally double-diffused metal oxide semiconductor field effect transistor is coupled to the gate control circuit. The source of the laterally double-diffused metal oxide semiconductor field effect transistor is further coupled to the electrostatic discharge protection circuit.

According to one aspect of the present invention, the power integrated circuit includes a transistor, wherein a source of the transistor is coupled to the electrostatic discharge protection circuit, and a gate of the transistor is coupled to the gate control circuit.

According to one aspect of the present invention, the transistor is a GaN high electron mobility transistor.

According to one aspect of the present invention, the transistor is a second metal oxide semiconductor field effect transistor or a silicon carbide (Sic) field transistor.

According to one aspect of the present invention, the source of the power integrated circuit is coupled to a pin of the combo circuit.

According to one aspect of the present invention, the electrostatic discharge protection circuit includes a first diode, a second diode, a third diode, a fourth diode. A first terminal of the first diode is coupled to the reference ground potential. A first terminal of the second diode is coupled to a second terminal of the first diode, and a second terminal of the second diode is coupled to the source of the power integrated circuit. A first terminal of the third diode is coupled to the source of the power integrated circuit. A first terminal of the fourth diode is coupled to a second terminal of the third diode, and a second terminal of the fourth diode is coupled to the reference ground potential.

According to one aspect of the present invention, the electrostatic discharge protection circuit includes a fifth diode and a sixth diode. A first terminal of the fifth diode is coupled to the reference ground potential. A second terminal of the sixth diode is coupled to a second terminal of the fifth diode, and a first terminal of the sixth diode is coupled to the source of the power integrated circuit.

According to one aspect of the present invention, the combo circuit further includes a high voltage start-up integrated circuit, wherein the high voltage start-up integrated circuit is used for generating a supply voltage to the pulse width modulation integrated circuit according to a direct voltage to make the pulse width modulation integrated circuit operate.

Another embodiment of the present invention provides a combo circuit with electrostatic discharge protection. The combo circuit with electrostatic discharge protection includes a high voltage start-up integrated circuit and a power integrated circuit. The high voltage start-up integrated circuit has an electrostatic discharge protection circuit. The electrostatic discharge protection circuit is installed between a source of the power integrated circuit and a reference ground potential of the combo circuit.

According to one aspect of the present invention, the combo circuit further includes a pulse width modulation integrated circuit, wherein the high voltage start-up integrated circuit generates a supply voltage to the pulse width modulation integrated circuit according to a direct voltage to make the pulse width modulation integrated circuit operate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
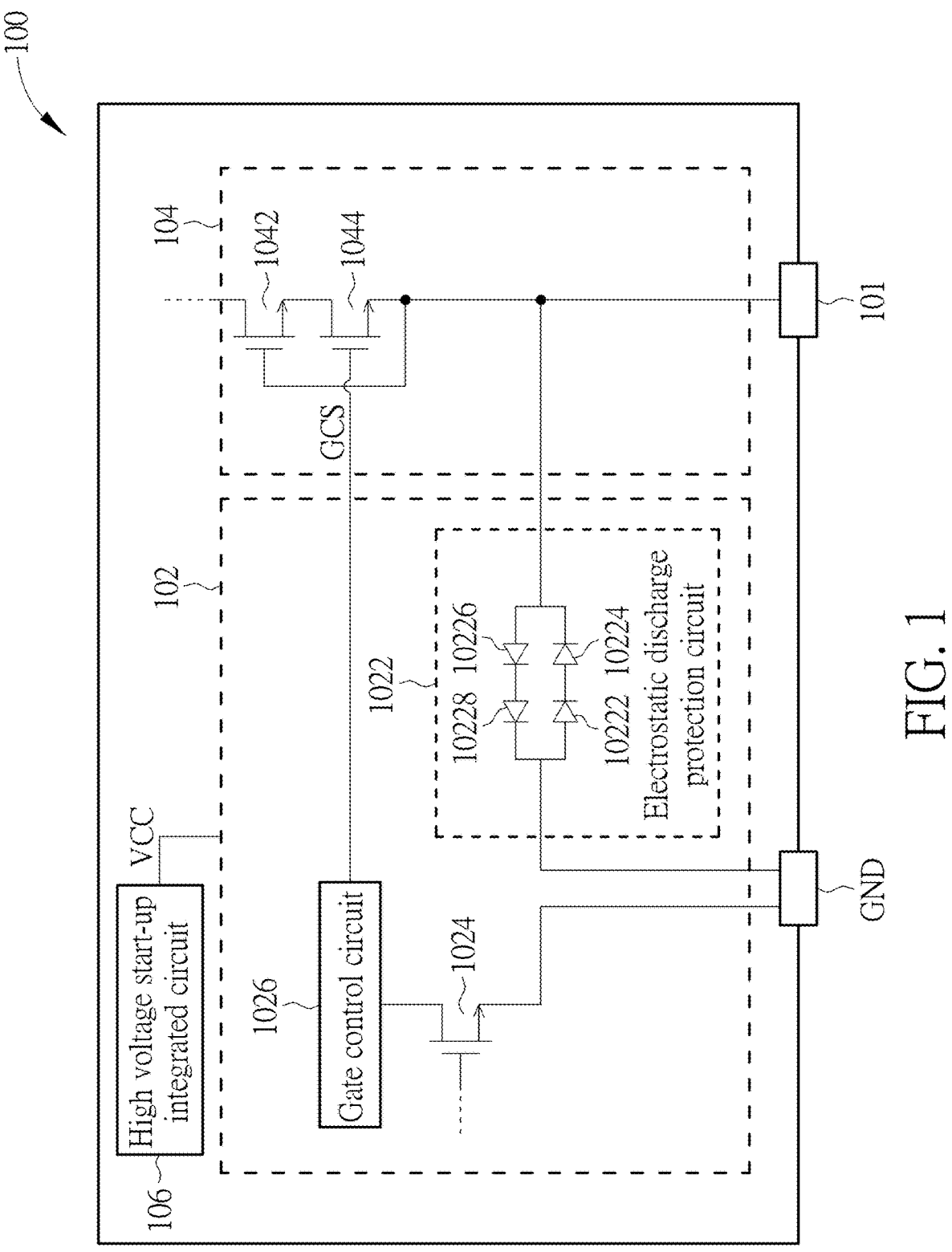
FIG. 1 is a diagram illustrating a combo circuit with electrostatic discharge protection according to a first embodiment of the present invention.

Please refer to FIG. 1. FIG. 1 is a diagram illustrating a combo circuit 100 with electrostatic discharge protection according to a first embodiment of the present invention, wherein the combo circuit 100 includes a pulse width modulation (PWM) integrated circuit 102, a power integrated circuit 104, and a high voltage start-up integrated circuit 106. In one embodiment of the present invention, the combo circuit 100 is applied to a primary side of a flyback power converter, and the high voltage start-up integrated circuit 106 can generate a supply voltage VCC to the pulse width modulation integrated circuit 102 according to a direct voltage of the primary side of the flyback power converter to make the pulse width modulation integrated circuit 102 operate, wherein the high voltage start-up integrated circuit 106 can adopt an architecture of a start-up circuit disclosed in the prior art, so further description thereof is omitted for simplicity. As shown in FIG. 1, the pulse width modulation integrated circuit 102 includes an electrostatic discharge protection circuit 1022, a first metal oxide semiconductor field effect transistor 1024, and a gate control circuit 1026, wherein the pulse width modulation integrated circuit 102 is not limited to only including the electrostatic discharge protection circuit 1022, the first metal oxide semiconductor field effect transistor 1024, and the gate control circuit 1026. That is to say, the pulse width modulation integrated circuit 102 can further include some functional circuits (not shown in FIG. 1), but the functional circuits are not the key points of the present invention, so further description thereof is also omitted for simplicity. In the pulse width modulation integrated circuit 102, a drain of the first metal oxide semiconductor field effect transistor 1024 is coupled to the gate control circuit 1026, a gate of the first metal oxide semiconductor field effect transistor 1024 is coupled to another circuit (not shown in FIG. 1) within the pulse width modulation integrated circuit 102, and a source of the first metal oxide semiconductor field effect transistor 1024 is coupled to a pin GND of the combo circuit 100, wherein there is a seal ring (not shown in FIG. 1) surrounding the combo circuit 100, the seal ring is coupled to the pin GND, and the pin GND has a reference ground potential. When a fab manufactures multiple dice on a wafer (each die includes the combo circuit 100), the sealing ring is used for preventing cracks caused by stress of a cutting saw blade from damaging dice next to the cracks when cutting the multiple dice on the wafer. The sealing ring needs to be connected to the pin GND to prevent static electricity generated during the process of cutting the multiple dice on the wafer from damaging the multiple dice.

In addition, as shown FIG. 1, the power integrated circuit 104 includes a gallium nitride (GaN) high electron mobility transistor (HEMT) 1042 and a double-diffused laterally metal oxide semiconductor field effect transistor (LDMOS) 1044, wherein a drain of the GaN high electron mobility transistor 1042 is coupled to the primary side of the flyback power converter, a source of the GaN high electron mobility transistor 1042 is coupled to a drain of the laterally double-diffused metal oxide semiconductor field effect transistor 1044, a gate of the GaN high electron mobility transistor 1042 is coupled to a source of the laterally double-diffused metal oxide semiconductor field effect transistor 1044, a gate of the laterally double-diffused metal oxide semiconductor field effect transistor 1044 is coupled to the gate control circuit 1026, and the source of the laterally double-diffused metal oxide semiconductor field effect transistor 1044 is further coupled to the electrostatic discharge protection circuit 1022, wherein the gate control circuit 1026 is used for generating a pulse width modulation signal (that is, a gate control signal) GCS to the laterally double-diffused metal oxide semiconductor field effect transistor 1044, and the laterally double-diffused metal oxide semiconductor field effect transistor 1044 is turned on according to the pulse width modulation signal GCS.

In addition, a function of the power integrated circuit 104 is similar to a function of a power switch disclosed by the prior art applied to the primary side of the flyback power converter, so further description thereof is omitted for simplicity. In addition, as shown in FIG. 1, a source of the power integrated circuit 104 (that is, the source of the laterally double-diffused metal oxide semiconductor field effect transistor 1044) is coupled to a pin 101 of the combo circuit 100. In addition, in another embodiment of the present invention, the laterally double-diffused metal oxide semiconductor field effect transistor 1044 can be replaced with a vertical double-diffused metal oxide semiconductor field effect transistor (VDMOS), or a silicon carbide (Sic) field transistor, or a super junction metal oxide semiconductor field effect transistor.

In addition, as shown in FIG. 1, the electrostatic discharge protection circuit 1022 is installed between the source of the power integrated circuit 104 and the pin GND. As shown in FIG. 1, the electrostatic discharge protection circuit 1022 includes a first diode 10222, a second diode 10224, a third diode 10226, and a fourth diode 10228, wherein a first terminal of the first diode 10222 is coupled to the pin GND, a first terminal of the second diode 10224 is coupled to a second terminal of the first diode 10222, a second terminal of the second diode 10224 is coupled to the source of the laterally double-diffused metal oxide semiconductor field effect transistor 1044, a first terminal of the third diode 10226 is coupled to the source of the laterally double-diffused metal oxide semiconductor field effect transistor 1044, a first terminal of the fourth diode 10228 is coupled to a second terminal of the third diode 10226, and a second terminal of the fourth diode 10228 is coupled to the pin GND.

Therefore, as shown in FIG. 1, because the electrostatic discharge protection circuit 1022 is installed between the source of the power integrated circuit 104 and the pin GND, and the electrostatic discharge protection circuit 1022 includes two conduction paths with opposite conduction directions (one of the two conduction paths is composed of the first diode 10222 and the second diode 10224, and the other of the two conduction paths is composed of the third diode 10226 and the fourth diode 10228), when the source of the power integrated circuit 104 (that is, the source of the laterally double-diffused metal oxide semiconductor field effect transistor 1044) has excess positive charges or excess negative charges, both of the excess positive charges and the excess negative charges can be neutralized by the reference ground potential through the electrostatic discharge protection circuit 1022, thus preventing the power integrated circuit 104 from being burned out.

In addition, the combo circuit 100 is not limited to only including the pin GND and the pin 101 and only including the pulse width modulation integrated circuit 102, the power integrated circuit 104 and the high voltage start-up integrated circuit 106. That is, the combo circuit 100 can include pins other than the pin GND and the pin 101, and also include function circuits other than the pulse width modulation integrated circuit 102, the power integrated circuit 104, and the high voltage start-up integrated circuit 106.

Figure 2A:
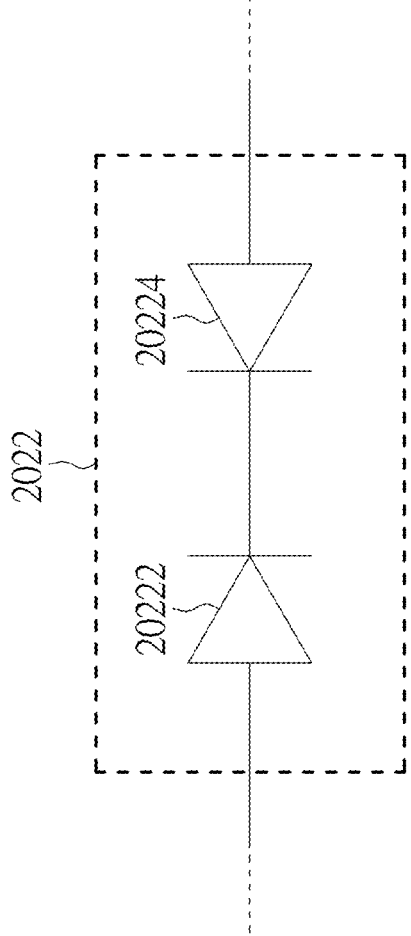
FIG. 2A is a diagram illustrating an electrostatic discharge protection circuit according to a second embodiment of the present invention.

Next, please refer to FIG. 2A. FIG. 2A is a diagram illustrating an electrostatic discharge protection circuit 2022 according to a second embodiment of the present invention, wherein a function of the electrostatic discharge protection circuit 2022 is the same as a function of the electrostatic discharge protection circuit 1022 shown in FIG. 1. As shown in FIG. 2A, the electrostatic discharge protection circuit 2022 includes a fifth diode 20222 and a sixth diode 20224, wherein a first terminal of the fifth diode 20222 is coupled to the pin GND, a second terminal of the sixth diode 20224 is coupled to a second terminal of the fifth diode 20222, and a first terminal of the sixth diode 20224 is coupled to the source of the power integrated circuit 104 (that is, the source of the laterally double-diffused metal oxide semiconductor field effect transistor 1044). Similarly, as shown in FIG. 2A, because the electrostatic discharge protection circuit 2022 is installed between the source of the power integrated circuit 104 and the pin GND, and the fifth diode 20222 and the sixth diode 20224 also provide two conduction paths with opposite conduction directions respectively, when the source of the power integrated circuit 104 (that is, the source of the laterally double-diffused metal oxide semiconductor field effect transistor 1044) has excess positive charges or excess negative charges, both of the excess positive charges and the excess negative charges can be neutralized by the reference ground potential through the electrostatic discharge protection circuit 2022, thus preventing the power integrated circuit 104 from being burned out.

Figure 2B:
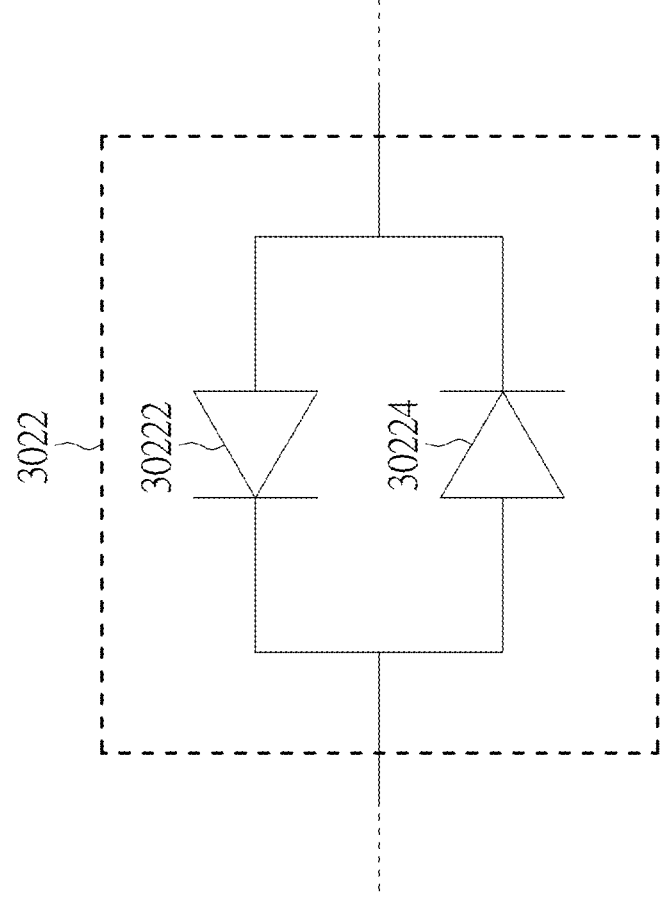
FIG. 2B is a diagram illustrating an electrostatic discharge protection circuit according to a third embodiment of the present invention.

Next, please refer to FIG. 2B. FIG. 2B is a diagram illustrating an electrostatic discharge protection circuit 3022 according to a third embodiment of the present invention, wherein a function of the electrostatic discharge protection circuit 3022 is the same as the function of the electrostatic discharge protection circuit 1022 shown in FIG. 1. As shown in FIG. 2B, the electrostatic discharge protection circuit 3022 includes a seventh diode 30222 and an eighth diode 30224, wherein a first terminal of the seventh diode 30222 is coupled to the pin GND and a second terminal of the seventh diode 30222 is coupled to the source of the power integrated circuit 104 (that is, the source of the laterally double-diffused metal oxide semiconductor field effect transistor 1044), and a first terminal of the eighth diode 30224 is coupled to the source of the power integrated circuit 104 and a second terminal of the eighth diode 30224 is coupled to the pin GND. Similarly, as shown in FIG. 2B, because the electrostatic discharge protection circuit 3022 is installed between the source of the power integrated circuit 104 and the pin GND, and the seventh diode 30222 and the eighth diode 30224 also provide two conduction paths with opposite conduction directions respectively, when the source of the power integrated circuit 104 (that is, the source of the laterally double-diffused metal oxide semiconductor field effect transistor 1044) has excess positive charges or excess negative charges, both of the excess positive charges and the excess negative charges can be neutralized by the reference ground potential through the electrostatic discharge protection circuit 3022, thus preventing the power integrated circuit 104 from being burned out.

Figure 2C:
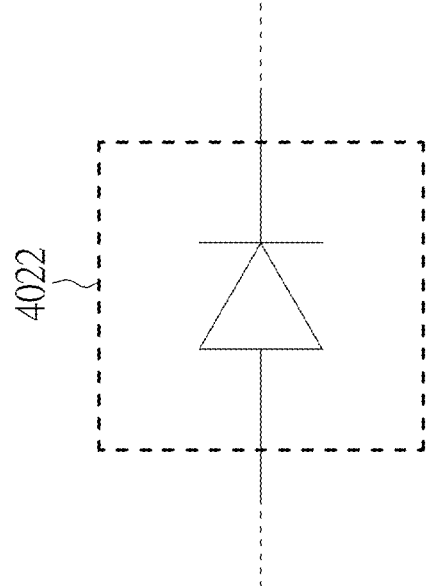
FIG. 2C is a diagram illustrating an electrostatic discharge protection circuit according to a fourth embodiment of the present invention.

Next, please refer to FIG. 2C, FIG. 2C is a diagram illustrating an electrostatic discharge protection circuit 4022 (that is, a diode) according to a fourth embodiment of the present invention, wherein a function of the electrostatic discharge protection circuit 4022 is the same as the function of the electrostatic discharge protection circuit 1022 shown in FIG. 1. As shown in FIG. 2C, a first terminal of the electrostatic discharge protection circuit 4022 is coupled to the source of the power integrated circuit 104 (that is, the source of the laterally double-diffused metal oxide semiconductor field effect transistor 1044) and a second terminal of the electrostatic discharge protection circuit 4022 is coupled to the pin GND. Similarly, as shown in FIG. 2C, because the electrostatic discharge protection circuit 4022 is installed between the source of the power integrated circuit 104 and the pin GND, and the electrostatic discharge protection circuit 4022 provides one conduction path, when the source of the power integrated circuit 104 (that is, the source of the laterally double-diffused metal oxide semiconductor field effect transistor 1044) has excess positive charges, the excess positive charges can be neutralized by the reference ground potential through the electrostatic discharge protection circuit 4022, thus preventing the power integrated circuit 104 from being burned out.

Figure 3:
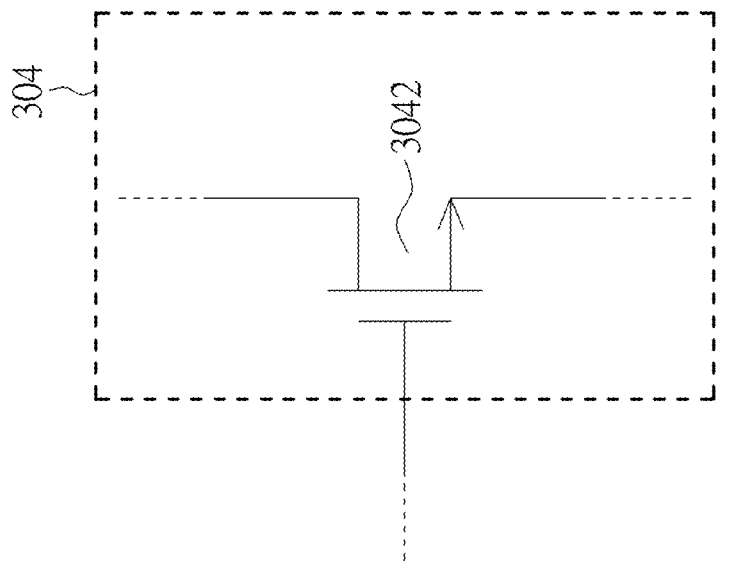
FIG. 3 is a diagram illustrating a power integrated circuit according to a fifth embodiment of the present invention.

Next, please refer to FIG. 3. FIG. 3 is a diagram illustrating a power integrated circuit 304 according to a fifth embodiment of the present invention, wherein a function of the power integrated circuit 304 is the same as a function of the power integrated circuit 104 shown in FIG. 1. As shown in FIG. 3, the power integrated circuit 304 includes a GaN high electron mobility transistor 3042, wherein a source of the GaN high electron mobility transistor 3042 is coupled to the electrostatic discharge protection circuit 1022 and the pin 101, and a gate of the GaN high electron mobility transistor 3042 is coupled to the gate control circuit 1026. Because the electrostatic discharge protection circuit 1022 is installed between a source of the power integrated circuit 304 (that is, a source of the GaN high electron mobility transistor 3042) and the pin GND, and the electrostatic discharge protection circuit 1022 includes two conduction paths with opposite conduction directions, when the source of the power integrated circuit 304 (that is, the source of the GaN high electron mobility transistor 3042) has excess positive charges or excess negative charges, both of the excess positive charges and the excess negative charges can be neutralized by the reference ground potential through the electrostatic discharge protection circuit 1022, thus preventing the power integrated circuit 304 from being burned out. In addition, in another embodiment of the present invention, the electrostatic discharge protection circuit 2022 substituting for the electrostatic discharge protection circuit 1022 is installed between the source of the power integrated circuit 304 (that is, the source of the GaN high electron mobility transistor 3042) and the pin GND. In addition, in another embodiment of the present invention, the GaN high electron mobility transistor 3042 can be replaced with a metal oxide semiconductor field effect transistor or a silicon carbide (Sic) field transistor.

Figure 4:
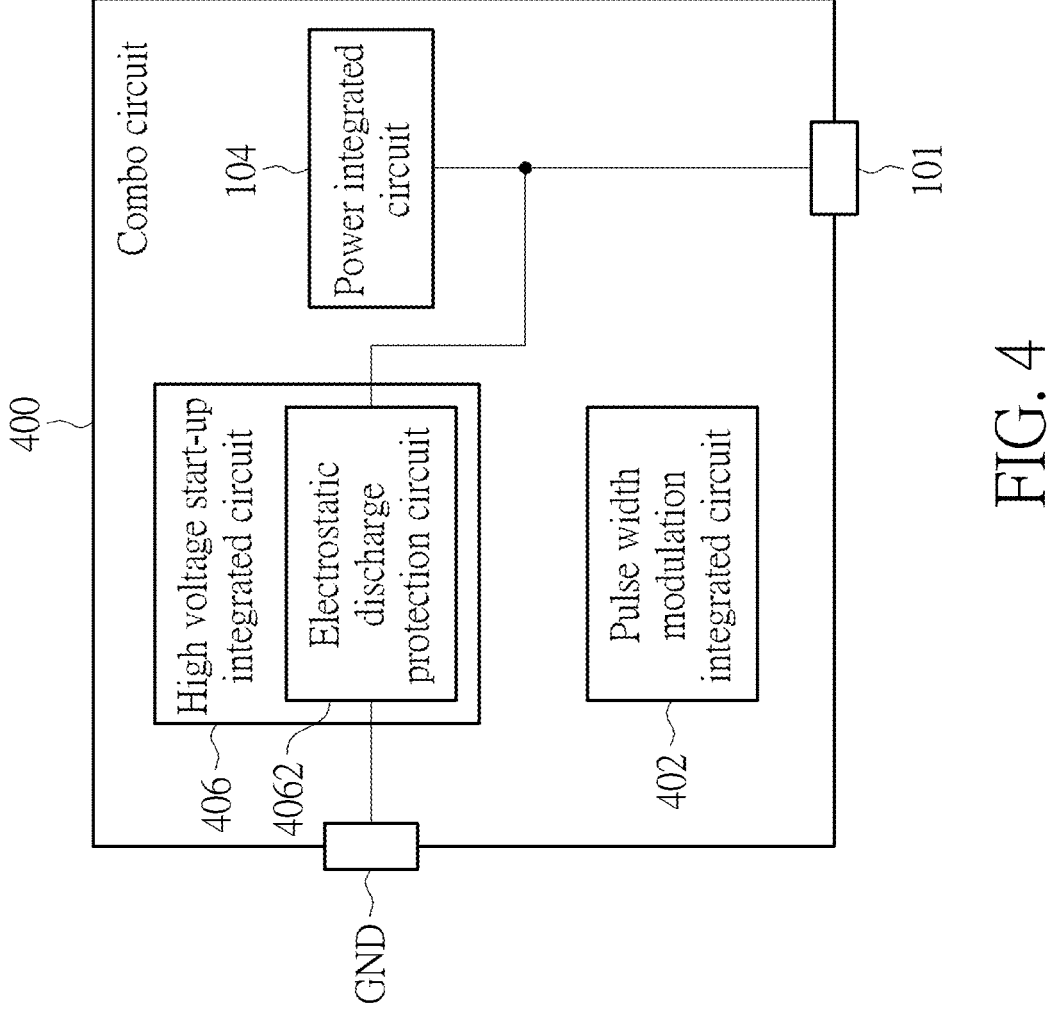
FIG. 4 is a diagram illustrating a combo circuit with electrostatic discharge protection according to a sixth embodiment of the present invention.

Next, please refer to FIG. 4. FIG. 4 is a diagram illustrating a combo circuit 400 with electrostatic discharge protection according to a sixth embodiment of the present invention, wherein the combo circuit 400 includes a pulse width modulation integrated circuit 402, the power integrated circuit 104 and a high voltage start-up integrated circuit 406. As shown in FIG. 4, a difference between the combo circuit 400 and the combo circuit 100 is that an electrostatic discharge protection circuit 4062 is included in the high voltage start-up integrated circuit 406, wherein an architecture of the electrostatic discharge protection circuit 4062 can be referred to architectures of the electrostatic discharge protection circuit 1022, the electrostatic discharge protection circuit 2022, the electrostatic discharge protection circuit 3022, and the electrostatic discharge protection circuit 4022, so further description thereof is omitted for simplicity. In addition, an architecture of the pulse width modulation integrated circuit 402 can be also referred to an architecture of the pulse width modulation integrated circuit 102, and an architecture of the power integrated circuit 104 of the combo circuit 400 can be also referred to an architecture of the power integrated circuit 104 shown in FIG. 1, so further description thereof is also omitted for simplicity. In addition, operational principles of the combo circuit 400 can be referred to the above-mentioned operational principles of the combo circuit 100, so further description thereof is omitted for simplicity.

To sum up, compared to the prior art, the present invention can increase capability of electrostatic discharge protection of the combo circuit, implement the combo circuit to reduce an area of the combo circuit through a signal chip combo process, make the combo circuit compatible with the current processes without additional cost, and easily find Infringement through whether there is additional wiring from the pulse width modulation integrated circuit to the power integrated circuit within in the combo circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A combo circuit with electrostatic discharge protection, comprising:
    a pulse width modulation (PWM) integrated circuit having an electrostatic discharge protection (ESD) circuit, wherein the pulse width modulation integrated circuit further comprises:
        a first metal oxide semiconductor field effect transistor, and
        a gate control circuit, wherein a drain of the first metal oxide semiconductor field effect transistor is coupled to the gate control circuit, a gate of the first metal oxide semiconductor field effect transistor is coupled to another circuit within the pulse width modulation integrated circuit, and a source of the first metal oxide semiconductor field effect transistor is coupled to a reference ground potential of the combo circuit, wherein the gate control circuit is used for generating a pulse width modulation signal to a power integrated circuit; and wherein the electrostatic discharge protection circuit is installed between a source of the power integrated circuit and the reference ground potential of the combo circuit.

2. The combo circuit of claim 1, wherein the power integrated circuit comprises:
    a gallium nitride (GaN) high electron mobility transistor (HEMT); and
    a laterally double-diffused metal oxide semiconductor field effect transistor (LDMOS), wherein a source of the GaN high electron mobility transistor is coupled to a drain of the laterally double-diffused metal oxide semiconductor field effect transistor, a gate of the GaN high electron mobility transistor is coupled to a source of the laterally double-diffused metal oxide semiconductor field effect transistor, and a gate of the laterally double-diffused metal oxide semiconductor field effect transistor is coupled to the gate control circuit;
    wherein the source of the laterally double-diffused metal oxide semiconductor field effect transistor is further coupled to the electrostatic discharge protection circuit.

3. The combo circuit of claim 1, wherein the power integrated circuit comprises:
    a transistor, wherein a source of the transistor is coupled to the electrostatic discharge protection circuit, and a gate of the transistor is coupled to the gate control circuit.

4. The combo circuit of claim 3, wherein the transistor is a gallium nitride (GaN) high electron mobility transistor.

5. The combo circuit of claim 3, wherein the transistor is a second metal oxide semiconductor field effect transistor or a silicon carbide (SiC) field effect transistor.

6. The combo circuit of claim 1, wherein the source of the power integrated circuit is coupled to a pin of the combo circuit.

7. The combo circuit of claim 1, wherein the electrostatic discharge protection circuit comprises:
    a fifth diode, wherein a first terminal of the fifth diode is coupled to the reference ground potential; and
    a sixth diode, wherein a second terminal of the sixth diode is coupled to a second terminal of the fifth diode, and a first terminal of the sixth diode is coupled to the source of the power integrated circuit.

8. A combo circuit with electrostatic discharge protection, comprising:
    a pulse width modulation (PWM) integrated circuit having an electrostatic discharge protection (ESD) circuit, wherein the electrostatic discharge protection circuit comprises:
        a first diode, wherein a first terminal of the first diode is coupled to a reference ground potential of the combo circuit;
        a second diode, wherein a first terminal of the second diode is coupled to a second terminal of the first diode, and a second terminal of the second diode is coupled to a source of a power integrated circuit;
        a third diode, wherein a first terminal of the third diode is coupled to the source of the power integrated circuit, and
        a fourth diode, wherein a first terminal of the fourth diode is coupled to a second terminal of the third diode, and a second terminal of the fourth diode is coupled to the reference ground potential; and
    wherein the electrostatic discharge protection circuit is installed between the source of the power integrated circuit and the reference ground potential of the combo circuit.

9. A combo circuit with electrostatic discharge protection, comprising:

a pulse width modulation (PWM) integrated circuit having an electrostatic discharge protection (ESD) circuit;

a power integrated circuit, wherein the electrostatic discharge protection circuit is installed between a source of the power integrated circuit and a reference ground potential of the combo circuit; and a high voltage start-up integrated circuit for generating a supply voltage to the pulse width modulation integrated circuit according to a direct voltage to make the pulse width modulation integrated circuit operate.

10. A combo circuit with electrostatic discharge protection, comprising:

a high voltage start-up integrated circuit having an electrostatic discharge protection circuit;

a power integrated circuit, wherein the electrostatic discharge protection circuit is installed between a source of the power integrated circuit and a reference ground potential of the combo circuit; and a pulse width modulation integrated circuit, wherein the high voltage start-up integrated circuit generates a supply voltage to the pulse width modulation integrated circuit according to a direct voltage to make the pulse width modulation integrated circuit operate.

* * * * *